United States Patent [19]

Bantz et al.

[11] 4,312,066
[45] Jan. 19, 1982

[54] DIAGNOSTIC/DEBUG MACHINE ARCHITECTURE

[75] Inventors: David F. Bantz, Chappaqua; Carlo J. Evangelisti, Jefferson Valley; Robert A. Nelson, Katonah, all of N.Y.

[73] Assignee: International Business Machines Corporation, Armonk, N.Y.

[21] Appl. No.: 107,992

[22] Filed: Dec. 28, 1979

[51] Int. Cl.³ .............................................. G06F 11/22
[52] U.S. Cl. ..................................... 371/16; 364/200
[58] Field of Search ........................... 371/16, 20, 200

[56] References Cited

U.S. PATENT DOCUMENTS

| | | | |
|---|---|---|---|
| 3,585,599 | 6/1971 | Hitt et al. | 364/200 |
| 3,761,695 | 9/1973 | Eichelberger | 371/25 |
| 3,764,995 | 10/1973 | Helf, Jr. et al. | 364/200 |
| 3,784,907 | 1/1974 | Eichelberger | 371/62 X |
| 3,786,430 | 1/1974 | Hajdu et al. | 364/200 |
| 3,838,260 | 9/1974 | Nelson | 371/16 |

OTHER PUBLICATIONS

Kulka et al., "Diagnostic Procedures", *IBM Tech. Disclosure Bulletin*, vol. 14, No. 9, Feb. 1975, pp. 2749–2750.
Smith "Fault Diagnostics in Multiprocessor Systems", *IBM Tech. Disclosure Bulletin*, vol. 22, No. 7, Dec. 1979, pp. 3002–3004.

*Primary Examiner*—David H. Malzahn
*Attorney, Agent, or Firm*—Roy R. Schlemmer, Jr.

[57] ABSTRACT

A system is described for enabling the connection of a diagnostic/debugging processor to another host processor for the purpose of troubleshooting that processor's hardware and software. The system is composed of an interface between the diagnostic/debugging processor per se and the host processor to be diagnosed, and of software resident in the diagnostic processor to perform functions required by the user of the system. The system is specifically designed for use with a host processor utilizing LSSD design rules.

10 Claims, 10 Drawing Figures

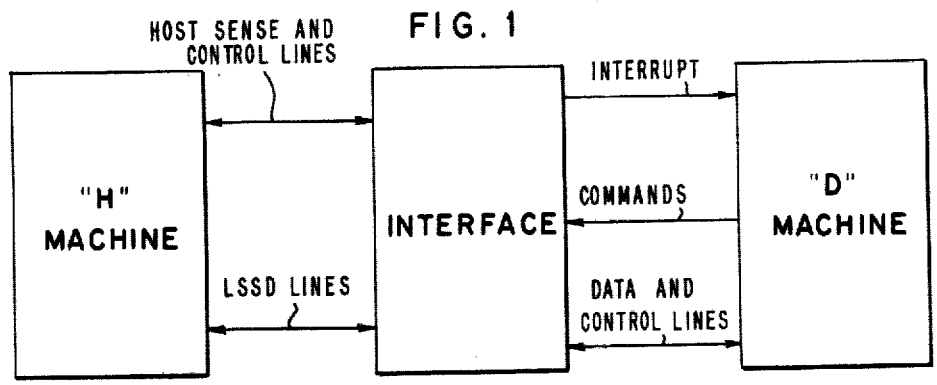
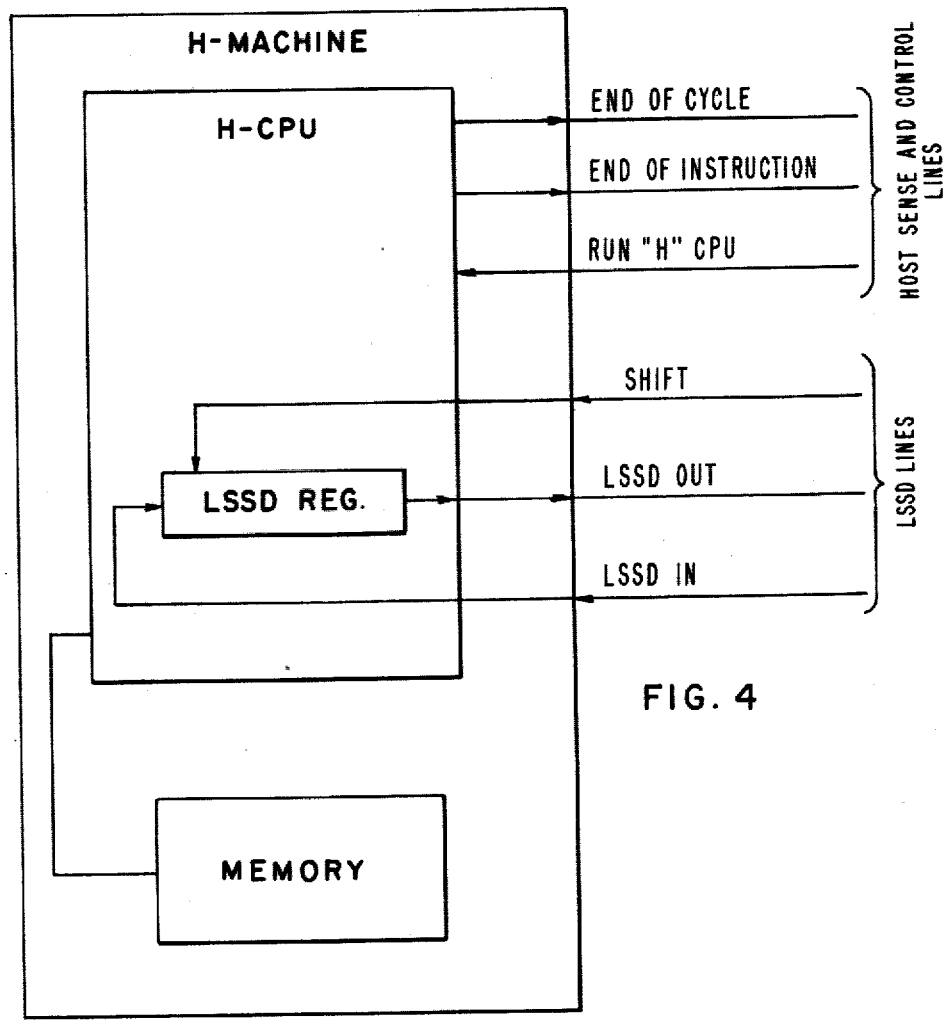

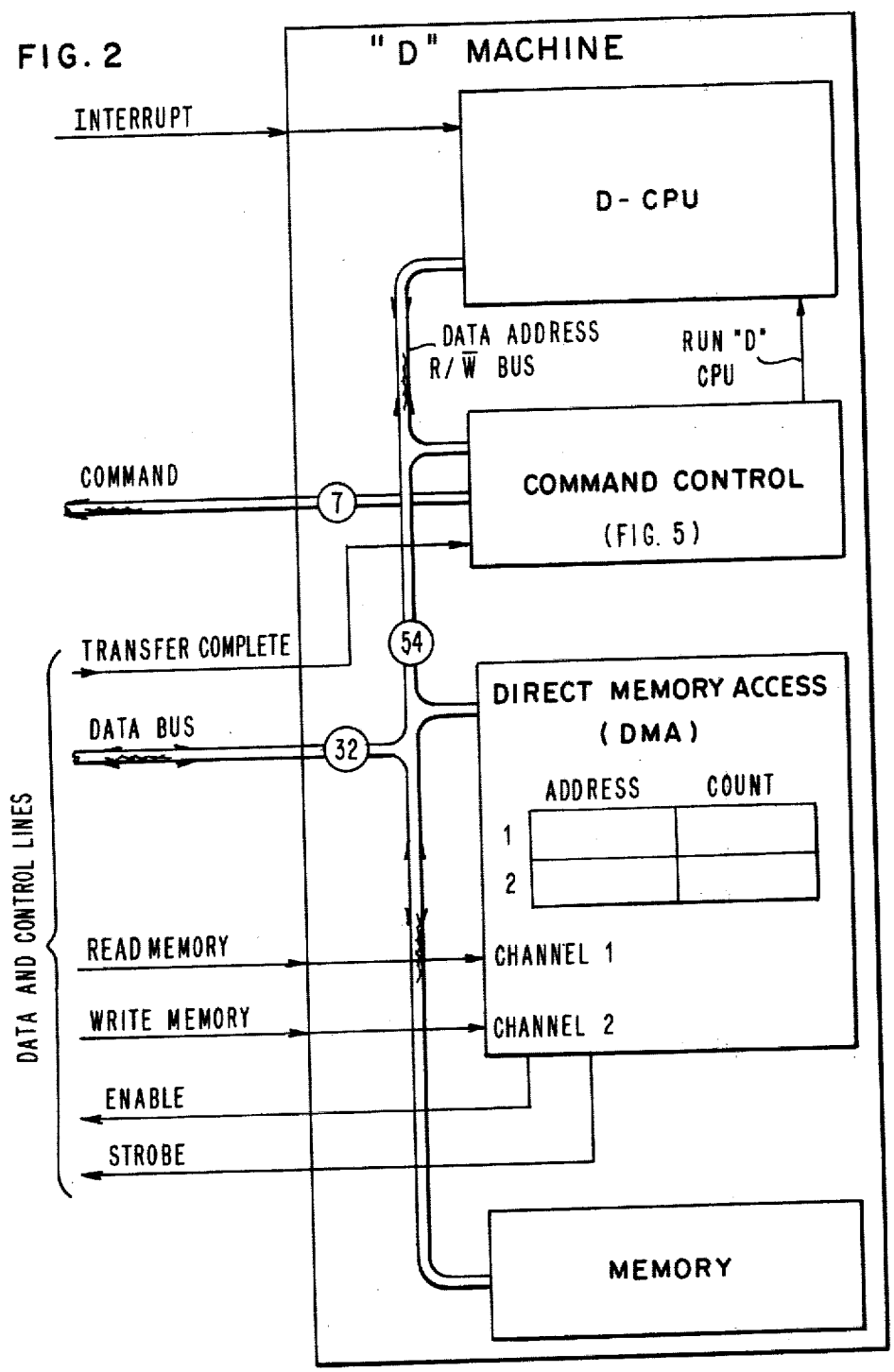

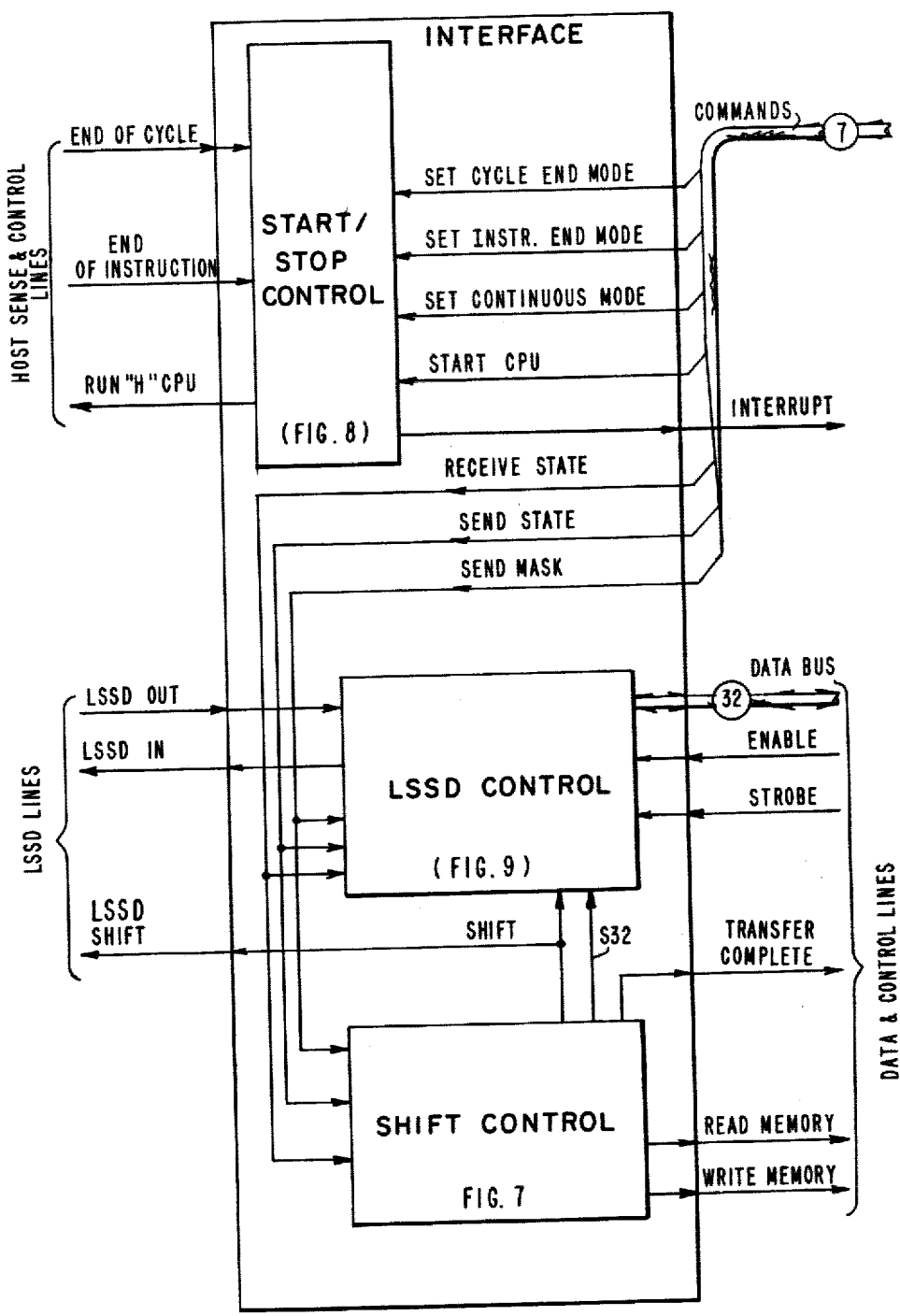

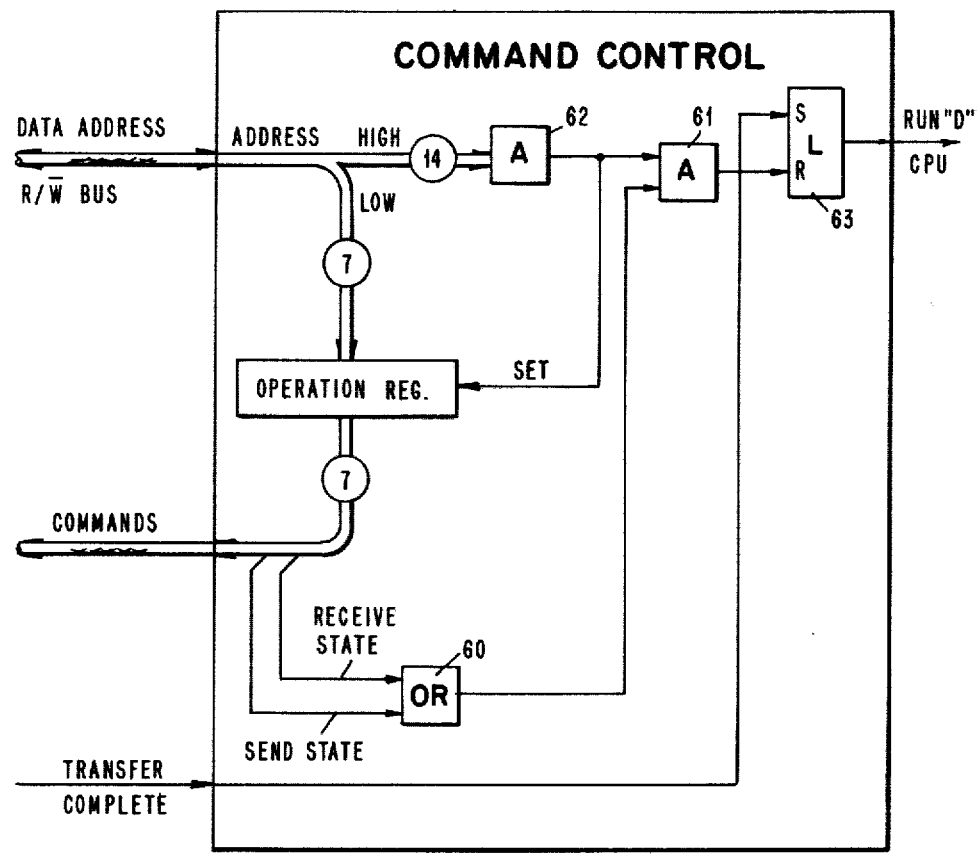

DIAGNOSTIC/DEBUG MACHINE ARCHITECTURE

DESCRIPTION

TECHNICAL FIELD

Electronic data processing systems, almost from their inception, have been provided with various types of error checking and diagnostic circuits and techniques for supervising the arithmetic and logical operations carried out within the same. Probably the best known among these error checking systems are parity check circuits which, as is well known, generate an additional parity bit on the basis of a fixed data length system. By means of the parity bit the number of bits within this fixed length data word is caused to always be either even or odd. The parity of the data length can be newly formed from one processing step to the next and be compared to the original one.

More sophisticated types of error detection mechanisms utilizing what are known as Hamming codes have been utilized in the past in systems where more sophisticated error detection capability is required. With the use of Hamming codes the particular portion of a fixed length data word in error may be accurately diagnosed. Depending upon the amount of additional data the system designer is willing to carry, errors may be diagnosed down to a single bit position utilizing Hamming code techniques.

With both parity bit techniques and Hamming code techniques the result of an "error" indication is simply that an error has been detected by the system and at this point some sort of diagnostic routine must be entered to determine the nature of the error and what must be done to correct same. The simplest form of corrective measure is normally a "retry" wherein the system causes the erroneous operation to be repeated in hopes that the error is transient in nature. If a particular system is sufficiently modular and an error is found to be non-transient, it is possible to often switch in a standby module for one that has been found to be defective. Still other corrective measures used in the very high reliability systems include Triple Modular Redundancy (TMR). In TMR systems critical portions of the system are redundantly designed. By this is meant that the three of each unit is included in the overall system and a voting circuit located at critical points at least two out of three of the results are the same. When one unit is found to deviate, an error is indicated however the system may continue to operate utilizing the majority output from the voting circuit. It is noted that even with TMR systems only the existence of an error is normally detected and not specific cause.

With most modern day computing systems, once an error is detected and an appropriate signal provided human personnel must intervene directly and normally cause special diagnostic procedures and hardware to interrupt the system operation to exhaustively diagnose that portion of the system which has been found to be defective. Stated very generally, most such diagnostic routines involve the exhaustive testing of the faulty modules with specially designed diagnostic data test patterns which are specifically designed to exhaustively test the hardware until particular permanent failure is isolated.

Such diagnostic procedures are extremely costly since the operation of the system must be totally interrupted for extended periods of time and further intervention of human operators or engineers is required. A recent development in the field of computer diagnostics has been the concept described as Level Sensitive Scan Design (LSSD) wherein the logical states within a computing system are provided with a special test register which can be directly accessed by suitable diagnostic programs so that as a test pattern is being passed through the system the condition of various circuits may be continuously monitored.

For a detailed description of the LSSD design concept, reference should be made to the three Eichelberger patents specified in the Background Art section of the specification and also in the "14th Design Automation Conference" Proceedings article set forth subsequently.

Another problem area with electronic data processing systems and particularly with sophisticated and complex modern computers is that of debugging or detecting errors in system software. Based on a recognition that system software errors are often very closely related to hardware errors, a current approach in the industry is one wherein both hardware and system software are debugged concurrently. The machine environment has become more complex with virtual memory, concurrent channels, imprecise interrupts, pipelined machines, and inerruptable instructions. The amount of machine states has greatly increased as well. The problem of debugging system software in this environment is difficult and the usual debugging facilities utilyzing one another's instruction traces are insufficient due to the complex interactions between the channels, interrupts, and the instruction execution. For example, in the IBM System/370 model 168, the MOVE CHARACTERS LONG instruction is interruptable in order to reduce interrupt latency. If the interrupt routine modifies the operands before returning, the effect of the instuction will be altered. These effects will not be reflected by a single-instruction trace facility. There is also no way to cause an interrupt to occur at a precise point during instruction execution in order to investigate these effects. What is required, in effect, is a machine that is controllable at a much finer level by the person debugging same.

It has been known to routinely use a small processor to gather and reduce information from a machine under test. When the debugging processor is not attached, the host computer runs full speed. Hardware is designed to allow easy access for the entire machine state to facilitate the debugging via the above referenced LSSD design rules. Such previously utilized debugging techniques only provide a means for diagnosing hardware faults, however, neither hardware nor software facilities are provided to support debugging of an arbitrary program on the main computer under arbitrary machine states. It will be readily recognized that there is a great need in the electronic data processing industry for continually improved methods for both diagnosing and debugging both the hardware and the system software of the host computer. It is also highly desirable that such diagnostic and debugging systems require a minimum of direct human intervention as a provision.

BACKGROUND ART

The following patents are illustrative of the LSSD testing arrangements and organizations and should be referred to for detailed descriptions of their underlying principles. It should be understood that the present invention does not claim any novelty in the use of any particular LSSD architecture, but only in the broad architectural organization of a Diagnostic/Debugging system having an appropriate interface for accessing all of the latch contained state information resident in the LSSD registers of the Host computer.

U.S. Pat. No. 3,783,254 entitled "Level Sensitive Logic System", application Ser. No. 297,543, filed Oct. 16, 1972, granted Jan. 1, 1974 to E. B. Eichelberger and of common assignee.

U.S. Pat. No. 3,761,695 entitled "Method of Level Sensitive Testing a Functional Logic System", application Ser. No. 298,087, filed Oct. 16, 1972, granted Sept. 25, 1973 to E. B. Eichelberger and of common assignee.

U.S. Pat. No. 3,784,907 entitled "Method of Propagation Delay Testing a Functional Logic System", application Ser. No. 298,071, filed Oct. 16, 1972, granted Jan. 8, 1974 to E. B. Eichelberger and of common assignee.

The following patents are cited as being generally exemplary of the system diagnostic art, particularly U.S. Pat. No. 3,786,430 entitled "Data Processing System Including a Small Auxiliary Processor for Overcoming the Effects of Faulty Hardware", application Ser. No. 198,881, filed Nov. 15, 1971, granted Jan. 15, 1974 to Johann Hajdu et al and of common assignee. This patent discloses an electronic data processing system comprising a main processor and an auxiliary processor and is designed to minimize the effects of hardware failure by intercepting the function of the main processor in the case of a hardware error. Although the auxiliary processor is in some sense a monitor, it is better described as an error processing system. It is linked to the data registers and function decoders of the main processor are designed solely so that it can accept the necessary input data in order to stimulate the operation of the main processor in the case of hardware failure. It then transfers the output data to the main processor once the simulated function is complete.

U.S. Pat. No. 3,585,599 entitled "Universal System Service Adapter", application Ser. No. 743,567, filed July 9, 1968, granted June 15, 1971 to D. C. Hitt and of common assignee. This patent discloses a universal adaptor which serves as an interface between its host computer and external equipment, another processor, for purposes of monitoring and testing the host. The adaptor is designed to receive diagnostic test control information from the external source for transmittal to the host system and to transmit system status information from the host to the external source. Testing is, however, limited to only certain hardware function, with test responses being of a pass/fail nature only. The transmitted information, i.e., from host to external equipment, is similarily limited to system status log messages.

U.S. Pat. No. 3,825,901 entitled "Integrated Diagnostic Tool", application Ser. No. 305,021, filed Nov. 9, 1972, granted July 23, 1974 to B. R. Golnek, Sr. et al and of common assignee. This patent discloses an integrated diagnostic tool which is an enhancement of the adaptor described in the Hitt patent, which permits testing and monitoring while the system is running at normal speed.

None of the above diagnostic system patents disclose a combination Diagnostic/Debugging processing system and are particularly absent of any suggestion of such a diagnostic tool specifically adapted and tailored to use with the LSSD design concept.

DESCRIPTION OF THE DRAWINGS

FIG. 1 is an organizational block diagram showing the overall architecture of the present system including the Host machine, the Interface and the Diagnostic/Debug machine.

FIG. 2 is a functional block diagram of the Diagnostic/Debug machine.

FIG. 3 is a functional block diagram of the Interface unit of FIG. 1.

FIG. 4 comprises a functional block diagram of that portion of the architecture of the Host machine, including the LSSD register and various control lines, requisite for interfacing with the present system architecture.

FIG. 5 comprises a combination functional and logical schematic diagram of the Command Control unit located in the Diagnostic/Debug machine.

FIG. 6 illustrates the address format of the instructions produced by the D-CPU to be utilized by the Command Control unit of FIG. 5.

SUMMARY OF THE INVENTION

Figure 7:
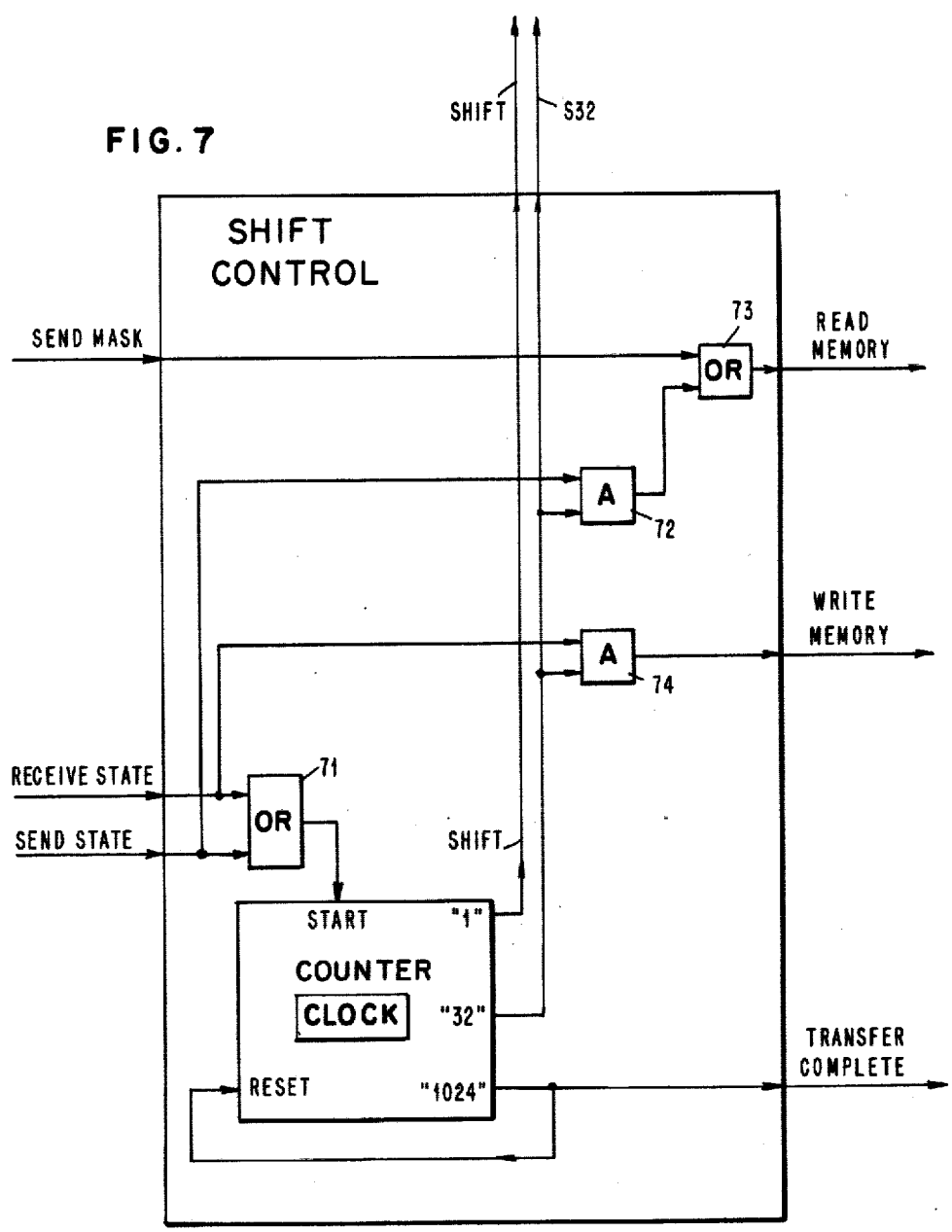
FIG. 7 comprises a combination functional and logical schematic diagram of the Shift Control unit located in the Interface unit of FIG. 3.

It is a primary object of the present invention to provide an improved diagnostic and debugging facility for use with highly sophisticated modern electronic data processing systems.

It is a further object of the invention to provide such a system for use with host CPUs designed in accordance with LSSD design principles.

It is yet another object of the invention to provide such a diagnostic and testing facility which is capable of three modes of operation. These are run continuous, stop at the end of each instruction, and stop at the end of each machine cycle.

DISCLOSURE OF INVENTION

The presently disclosed Diagnostic/Debug system including its own unique Interface unit is specifically designed and intended for use with a Host computer embodying the LSSD design concept throughout. It should be noted that the present invention is intended to cover only the overall architecture of such a system and not any specific diagnostic programs or routines utilized by the diagnostic computer once an error or some other anomalous situation occurs. Thus the presently disclosed architecture discloses an architectural framework providing all the necessary controls for interfacing with a Host computer's interrupt system for the purpose of transferring requisite LSSD state data and for signaling the Host system when it is to continue running.

Also disclosed herein are the necessary registers and controls for saving LSSD state data from the Host system and returning said state data back to the LSSD registers of the Host system in either original or altered form.

According to an additional aspect of the presently disclosed system, controls are provided for examining only a specified portion of the state data obtained from the Host system's LSSD registers which results in a minimizing of interrupt time for the Host CPU.

It will be noted from the following description that the only physical Host lines required by the present system's Interface are a line for obtaining "end of cycle" and "end of instruction" data signals. Also a "continue Operation" (Run H-CPU) line must be provided for telling the Host CPU to continue its normal operating mode or remain interrupted, which signal is produced by the present system. Additionally, two lines must be provided for accessing LSSD state data from the machine and for returning LSSD state data to the machine. Further, an LSSD register shift control line must be provided by the present system for control of the shifting of data into and out of the Host machine's LSSD registers. It will be appreciated that such control lines are readily available at the external interface of an LSSD designed machine.

It will also be readily understood by those skilled in the art that the herein disclosed Diagnostic/Debug system provides an architecture which will allow a variety of hardware, error checking as well as software debugging functions to be performed. By providing a fineness of control in the present system to the point where the Host computer may be interrupted at the completion of every machine cycle, extremely powerful and exhaustive testing of the Host system is possible.

The present Diagnostic/Debug system allows the machine state and the memory of the Host CPU to be captured at the end of an instruction or at the end of a cycle as stated above. It further allows selective reading and writing of the memory state by conditioning the H-machine with state information that will cause words from or to memory to be transferred to the D-machine. The system allows control over interruption, channel activity and address translation and provides a diagnostic CPU with its own memory to perform diagnostic and debug functions. These and other objects, features and advantages of the system will be apparent from the subsequent description of the preferred embodiment of the system.

Before proceeding with a detailed description of the present system there will follow a very brief description of the principles of Level Sensitive Scan Design (LSSD) concepts to more clearly place the present invention in perspective. The common main thrust of the LSSD design concept is to prescribe a built-in capability for every replaceable module, whereby the entire logic state of the unit, when under test, can be explicitly set and/or examined through exercising certain input/output (I/O) procedures at a limited number of I/O terminals. This requirement is implementible by imparting a shift-register capability to every one of the logic system latches in the unit and thereupon organizing these shift register latches (SRL) into one or more shift register data channels with their terminal stages accessible to the outside world (via the Interface).

Details of operations using the SRL facility for various aspects of the testing purposes are given in most of the aforementioned patents. Particular reference may be made to FIG. 8 of U.S. Pat. No. 3,761,695 and FIGS. 7, 8 and 9 of U.S. Pat. No. 3,784,907. Stated very briefly, the LSSD approach comprises a test operation wherein certain desired logic-test patterns are serially inputted and shifted to the appropriate latch locations when the unit is operated in the "shift mode", so to speak, (i.e., by withholding the system clock excitations and turning on the shifting clock to the unit). When this is done, the latch states will provide the desired stimuli for the testing of the related logic nets. Now, propagate the test patterns through the nets by executing one or more steps of the "Function Mode" operation (i.e., by exercising one or more system clock excitations). The response pattern of the logic networks to the applied stimuli is now captured by the system latches, in a known manner depending on certain details of hardware design, often replacing the original inputted test patterns. Then the system reverts to the shift-mode operation, outputting the response patterns for examination and comparison with standard patterns which should be present if the circuitry has operated properly.

It will be appreciated that the I/O terminals referred to in the above description would be replaced by the Interface unit of the present Diagnostic/Debug system. It is further assumed that all of the LSSD registers in the Host CPU would be connected together in a predetermined fashion to in effect form one extremely long continuous shift register. Alternatively, the latches could be organized into multiple shorter shift registers, selected by known means by the D-machine before specific state information is accessed. For the purposes of the present system it is assumed that this register would be no longer than 32 words each containing 32 bits. This will be apparent from the subsequent description. An extension of the present design to accommodate a longer LSSD register is set forth.

BEST MODE FOR CARRYING OUT THE INVENTION

There will now follow a general description of the operation of the present system which should be read with reference to the included figures. It will be noted generally that FIG. 1 comprises, in essence, an organizational drawing of the present Diagnostic/Debug system connected to a Host. FIGS. 2, 3 and 4 comprise more detailed functional block diagrams of the hardware of each of the blocks of FIG. 1. Similarly, FIGS. 5, 7, 8 and 9 are combination functional block and logical schematic diagrams of the primary functional units of FIGS. 2 and 3.

It will also be noted in referring to the figures that all of the lines and cables interconnecting the various units are shown as such with the exception of FIG. 1. It will be appreciated that each of the single lines will carry a signal representing, i.e., a "1" or a "0", which would be represented, for example, by either a zero voltage appearing on the line ("0") or some predetermined positive or negative voltage differing from zero ("1"). Similarly a pulse might periodically appear on a line such as with the shifting pulse, which emanates from the Interface unit of FIG. 3 to control the LSSD register within the H-machine. The cables are marked to indicate the number of lines in same. Thus, referring to FIG. 2, the data bus used for the transfer of 32 bit data words between the LSSD Control block located in the Interface unit on FIG. 3, and the D-machine contains 32 lines for transferring a data word in parallel between these units on command. It will be similarly noted that the LSSD Out and LSSD In lines utilized for transferring state data between the LSSD register in the H-machine and the registers within the LSSD Control block of Interface unit are single lines. This configuration is necessary since, as will be remembered, all of the latches making up the total LSSD register in CPUs utilizing the LSSD design concept are in fact shift registers which can only be serially shifted (and read out) a bit at a time.

Also in FIG. 2 within the D-machine, the data bus is shown as containing 32 bits as it emanates from the Interface unit and 54 bits as it passes into the Command Control block in the D-CPU. This is because only the state data words of 32 bits are being transferred between the Interface unit and the D-machine and no address data is included therewith as the storage locations or addresses for the data coming from and going to the Interface unit are specified by the instructions contained within the D-CPU. However, within the D-machine the bus format is considered to have 54 bits of which 32 bits are data bits and 22 bits are devoted to address plus a read/write bit. As will be apparent from the subsequent description of FIG. 6 the address per se utilizes 21 bits and a read/write bit is a single bit.

Referring now specifically to the drawings, FIG. 1 shows an overall view of the Diagnostic/Debug system including a Diagnostic/Debug machine (D-machine) connected to a Host machine (H-machine) via an Interface. Any one of seven commands may be issued by the D-machine. These are carried to the Interface via the command lines. In the Interface, commands are interpreted and the state of the H-machine is selectively retrieved or selectively changed via the LSSD lines. In addition the H-machine signals the Interface, via the host sense and control lines, when it has stopped and the Interface will in turn run the H-machine or keep it stopped. The mode of operating the Host is established by three of the seven commands. The three modes are run continuous, stop at end of cycle and stop at end of instruction. Communication between the Interface and the D-machine, including memory, is via the data and control lines. The interface can transfer state data to either the H-machine or the D-machine. State data is intended to refer to the specific data content obtained from or to be stored in the LSSD latches of the H-machine where it specifies the state of the operational latches of said H-machine. Additionally, an interrupt, via the interrupt line, is sent to the D-machine whenever the H-machine has stopped. This interrupt is used by the D-machine to send or receive state data and start the Host CPU (H-CPU).

FIGS. 2, 3 and 4 respectively describe in more detail the D-machine, the Interface and the H-machine.

FIG. 2 shows that the D-machine consists of a CPU (D-CPU), a Command Control unit and a direct memory access (DMA) unit for allowing the Interface to access memory and the D-CPU memory. The DMA is a conventional direct memory access such as AM9517 Multimode DMA Controller manufactured by Advanced Micro Devices or a PPS-8 DMA Controller manufactured by Rockwell Inc. The DMA is a device for providing access to a memory. It contains, as shown, an address and count register for each of two channels. These can be loaded from the D-CPU. When data is read or written into the memory via a channel, the address and count for that channel are incremented. Thus, when the next access is made, the registers have correct values. In this configuration the respective function of the two channels are: channel 1 to read the memory of the D-machine and channel 2 to write the memory of the D-machine. The DMA emits a signal when the data bus is available for reading (strobe signal) and a signal for writing (enable signal). A typical operation of the DMA is to receive a request to either read or write memory. The DMA sends a request signal to the D-CPU and when the acknowledgement signal is received, the data bus is available and appropriate strobe and enable signals are issued to be used by the requester of either channel 1 or channels 2. In the present application of the DMA, the D-CPU is stopped when data is transferred to and from the Interface. The 'run D-CPU' signal from the Command Control accomplishes this.

The Command Control constantly monitors the address portion of the data/address/R/W bus. It detects an address of a given range, interprets that address as a command, and issues a signal on the commands lines to the Interface. At the same time it issues a signal on the 'run D-CPU' line to control whether the D-CPU should be running or stopped. There are two commands (send state and receive state) which require a long transfer of data. When this transfer of data is complete, the transfer complete signal is received from the Interface. This signal is used to resume operation of the D-CPU. When the H-machine has stopped, the interrupt signal is received by the D-CPU, which may interrogate the state and perform any other necessary function. It may read (or write) into the memory of the H-machine by saving the state of the H-CPU, sending a new state to cause a word of memory to enter a general register (or transfer the contents of a register into memory) and then restoring the internal state of the H-CPU. All of this is accomplished via the LSSD register in the H-machine.

FIG. 3 shows the Interface consisting of three sections of Start-Stop Control, LSSD Control, and Shift Control.

The Start-Stop Control receives signals which control the mode of operation of the H-machine and a signal for controlling starting of the H-CPU. It receives input from the H-CPU which determines when the H-CPU is at an 'end of cycle' or when it is at an 'end of an instruction'. The Start-Stop Control issues the 'run H-CPU' signal which controls whether the H-CPU is to run or is to be stopped. The Logic of Start-Stop Control also issues the interrupt to the D-CPU notifying it that the Host has halted at which time the D-CPU may interrogate the state of the H-CPU.

The LSSD Control operates under three commands: 'receive state', 'send state' and 'send mask'. These commands allow the D-CPU to receive state data under the control mask, send state data under the control mask or set a new mask in the Interface. LSSD Control uses the data bus to obtain state information and masks from the D-machine. It uses the strobe and enable signals from the DMA in the D-machine as conditions for reading or writing the data bus.

The shift control contains a counter which issues a signal every time that the LSSD register is to be shifted. After 32 shifts it issues a signal (S32) allowing a word to be written into or read from the D-machine under control of the mask. When the full state information has been transferred, a 'transfer complete' signal is issued to the D-machine. The 'receive state', the 'send state' and 'send mask' signals are used to specify the read memory and write memory commands to the DMA.

LSSD Control receives a stream of bits from the LSSD register in the H-CPU and issues a stream of bits to the LSSD register. The 'receive state' command determines that a preselected number of words (32 bits) from the stream coming from the LSSD register will be transferred to the D-machine memory. The 'send state' command specifies that a set of state words from the memory of the D-CPU will be merged with the current state of the H-CPU and sent to the LSSD register in the H-CPU.

FIG. 4 illustrates how the H-CPU signals the Interface when it is at the end of a cycle or at the end of an instruction. The interface responds with a 'run H-CPU' signal causing the H-CPU to resume processing or stay in a halt state. The two data lines from the Interface are used to obtain a bit from the LSSD register and at the same time send a bit into the LSSD register under the control of the shift signal. The LSSD (Level Sensitive Scan Design) register is the means of shifting latch data into and out of the H-CPU.

The latches hold the internal state of the CPU. For still further description of the LSSD design concept, see E. B. Eichelberger and T. W. Williams, A logic Design Structure for LSI Testability, 14th Design Automation Conference, New Orleans, 1977, p. 462-468.

As stated previously the present system architecture for a Diagnostic/Debug machine is concerned with the overall architecture necessary for interfacing with the Host CPU and obtaining the requisite state data from the LSSD registers and placing either the same or modified state data back into the LSSD registers. It will also be noted that the D-machine itself may be a complex stand-alone computer concerned with performing sophisticated diagnostic routines in its own right. The significance of the architecture of the present invention is that a means is provided for transferring requisite state data between the Host machine and D-machine in an extremely efficient and self-contained manner. It is the function of the Command Control block to FIG. 5, to detect when the D-machine wishes to take some action involving the state data located in or to be stored in the LSSD registers of the Host machine. This is done by means of special address patterns located in the address portion of the D-machine instruction. For the present embodiment, as will be explained subsequently, the particular bit pattern appearing in a first portion of the address field indicates to the Command Control block that an instruction involving itself has been detected. The particular instruction or command is detected by analyzing a second portion of the address field. Thus as instructions are being continually processed by the D-machine and the D-CPU in particular, the instructions continuously appear on the address portion of the bus entering the Command Control block. However, of all the many addresses which are produced by the D-CPU and placed on the data address R/W bus, only the particular bit pattern which indicates that a command is to be given to the present data acquisition architecture will cause the Command Control block to be activated as will be well understood.

FIGS. 5 and 6 show the details of the command control structure in the D-machine. When the D-CPU issues an instruction such as store general register N (in the D-machine) in location A in memory, where A has the particular format (14 high order one bits) described below, then one of the seven commands lines is raised.

FIG. 5 shows that the address bus is split from the data bus and is then split into the high order and the low order. The high order part is fed into a 14 input AND and if the output is true, the signal is used to set the operation register with the lower order part of the address bus. The operation register output is sent via the commands lines to the Interface. The 'receive state' and the 'send state' lines are ORed in OR 60 and the ANDed in AND 61 with the output of the 14 input AND circuit 62. This signal is in turn used to reset latch 63 which determines whether the D-CPU is to run or is to remain halted. The latch 63 is set by the 'transfer complete' signal from the interface.

FIG. 6 shows the address of such an instruction. When the instruction is executed, the address part is placed on the address bus. The address consists of a high order part of 14 bits and a low order part of 7 bits. The high order part of the address is all ones. This signals Command Control that the D-CPU is issuing one of 7 commands, which of the seven commands is coded in the low order 7 bits or the address. Only one of these bits is on to identify the indicated command.

FIG. 7 shows the details of the Shift Control block. The main component is a Counter which is started via OR circuit 71 by either the 'receive state' or 'send state' command. It will be noted that the Counter contains a system clock which is chosen to have a frequency compatible with the system clock of the Host machine so that its shifting rate will be adaptable for controlling the LSSD registers contained therein. The counter is of any type well known in the art and is shown as having three outputs. These are labelled as "1", "32" and "1024". The output labelled "1" is the basic shift pulse utilized to effect the shifting of bits within the LSSD control blocks in the Interface unit and also the LSSD registers within the H-machine. This line would be the simple output of the basic clock. The output labelled "32" produces the S32 pulse. This line produces a pulse after every 32 shift pulses (operates Mod 32). As will be understood in referring to the LSSD Control block of FIG. 9, the S32 pulse controls the gating of 32 bits of data in parallel into or out of the Input and Output registers and controls the shifting of the Mask Register.

Finally, the output from the Counter labelled "1024" indicates that a complete state data transfer has occurred between the LSSD Register in the H-CPU and the Interface Unit. Thus, this output is used to signal the D-machine that a data transfer is complete and also resets the counter. Output "1" (low order bit) of the Counter gives a shift signal every time a bit is to be shifted into the LSSD register. As stated previously, output "32" is the S32 signal, and is issued whenever a word (=bits) may be transmitted to or from the D-machine. The LSSD register is assumed to contain 32 times 32 bits or 1024 total bits and thus output "1024" of the Counter signals the 'end of the transfer' of state data to or from the LSSD register (if the H-machine requires more than 1024 bits the extension can be made in a straightforward manner). This 'transfer complete' signal resets the Counter and is sent to the D-machine to resume the running of the D-CPU. The 'read memory' signal is generated when the AND circuit 72 receives the 'send state' command and the S32 signal or when the 'send mask' signal is present (via OR circuit 73). The 'write memory' signal is generated by AND circuit 74 when a 'receive state' command coincides with the appropriate time signal from the counter which is the S32 signal.

Figure 8:
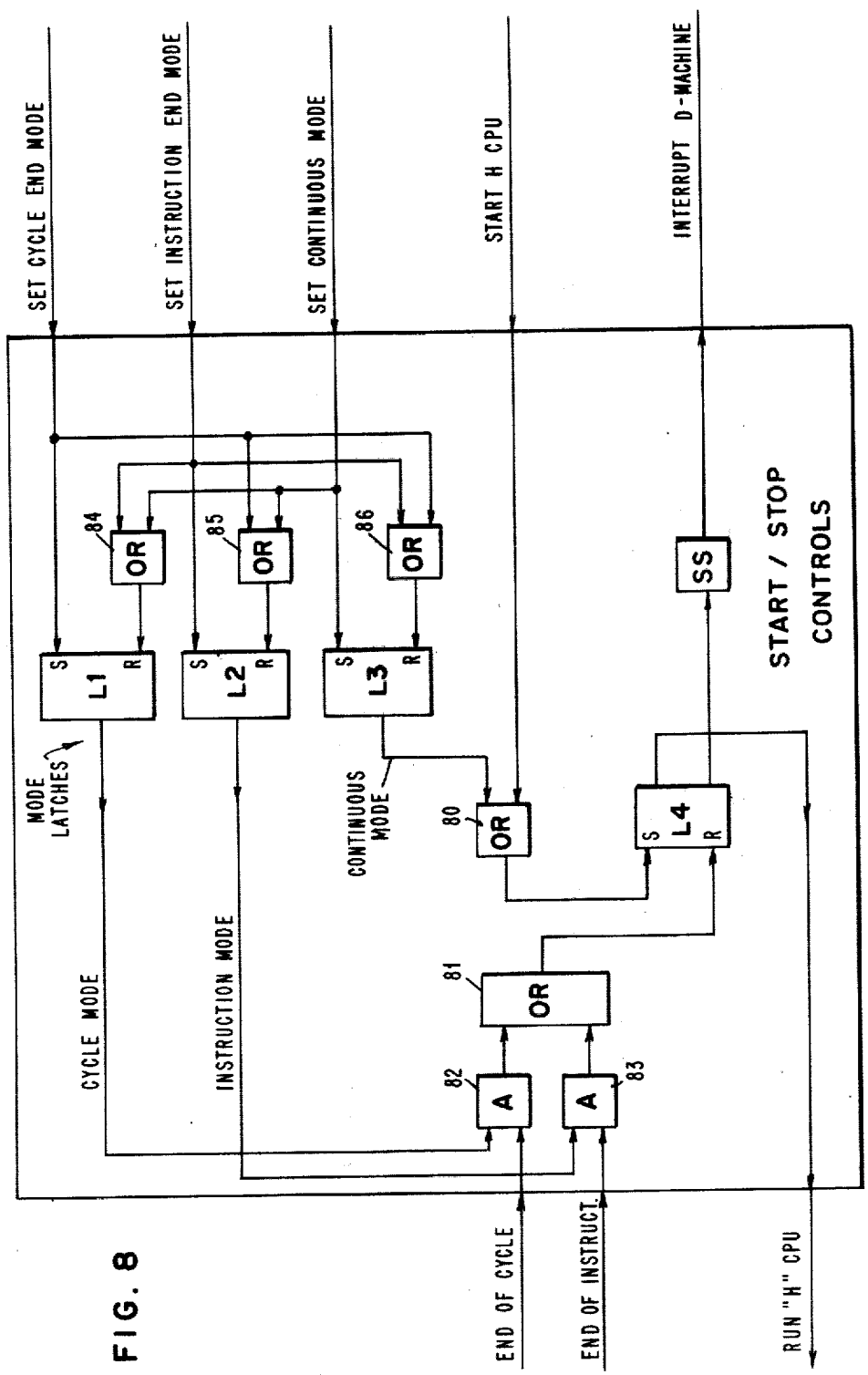
FIG. 8 comprises a combination functional and logical schematic of the Start/Stop Control unit of the Interface unit of FIG. 3.

FIG. 8 shows the Start-Stop control. The three lines representing the mode commands (set cycle end mode, set instruction end mode and set continuous mode) are used to control the three latches L1, L2 and L3. Only one of the latches is on at a time. Each mode command turns on one of these latches and resets the other two latches via OR gates 84, 85 and 86. Latch L4 determines whether an 'interrupt' signal is to be sent to the D-machine and the status of the 'run H-CPU' signal. It is set via OR circuit 80 by the 'start H-CPU' signal or the 'continuous mode' signal from mode latch L3. The condition for resetting the latch is the logical OR of two subconditions via OR circuit 81. In the first subcondition the H-CPU is at an 'end of cycle' and the cycle mode latch L1 is on. The second subcondition is that the H-CPU is at an 'end of instruction' and the instruction mode latch L2 is on. The two aforementioned subconditions are implemented as inputs to OR circuit 81 via an output from one of the AND circuits 82 and 83 respectively.

Figure 9:
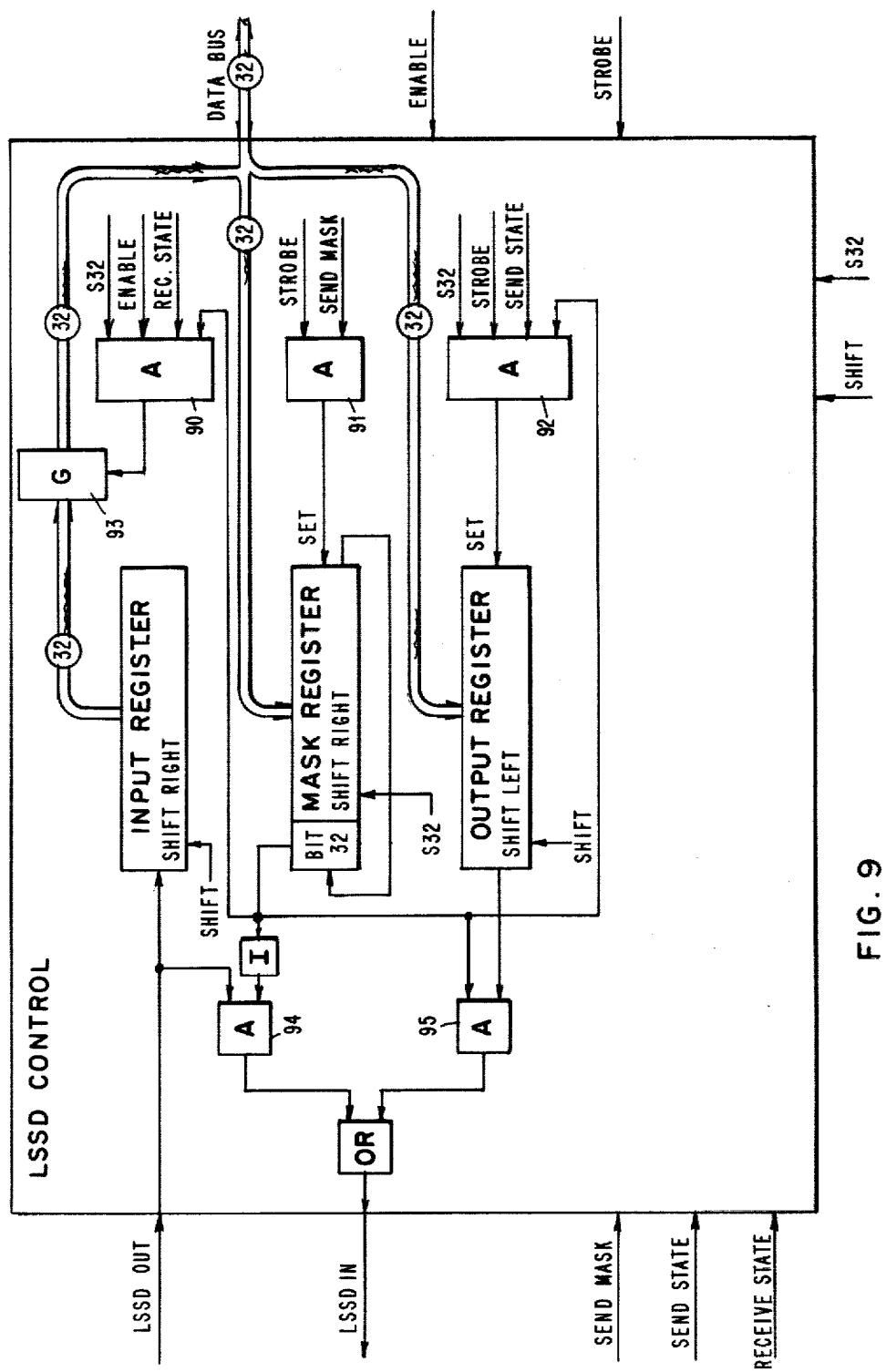
FIG. 9 comprises a combination functional block and logical schematic diagram of the LSSD Control unit of the Interface unit of FIG. 3.

FIG. 9 shows the LSSD Control. A stream of bits is received from 'LSSD out' and passed with possible modification to 'LSSD in'. Under the control of bit 32 (high order bit) of the Mask register a stream of bits from the Output register may be substituted. Also a stream from LSSD out, being loaded into the Input register may transfer to the D-machine under control of the mask register (via bit 32).

The LSSD Control is under control of the three commands: 'receive state', 'send state' and 'send mask'. During the 'receive state' operation, the bit stream from 'LSSD out' enters the Input register under the control of the 'shift' signal. If the bit 32 of the Mask register is a 1 and three other conditions are in the 1 state, AND circuit 90 is enabled and its output enables Gate 93 whereby the contents of the Input register is placed in parallel on the data bus. The three other conditions (inputs to AND 90) for gating the contents of the input register to the data bus are: S32 is up (32 bits have been received), the 'receive state' command is in operation and finally, that the 'enable' signal has been received from the DMA.

If the 'send state' command is in operation, bit 32 of the mask register determines whether bits from the output register are to be placed on the 'LSSD in' lines. Bit 32 of the mask register and its complement are fed to AND circuits 94 and 95 for gating. A bit stream will pass through one of these gates. In one case the stream comes from 'LSSD Out' and in the other case the stream comes from the Output register which is under control of the shift signal. Setting or loading the Output register is determined by three conditions: the 'send state' command is in effect, S32 time has arrived and the DMA 'strobe' signal is present indicating the data bus is available. These three signals (together with a '1' in bit 32 of the Mask register) enable AND 92.

The 'send mask' command loads a mask from the D-machine into the Mask register. The Mask register is a circular shift register under control of the S32 signal. The new mask is obtained from the D-machine when the 'send mask' command is performed and the 'strobe' signal has been received from the DMA indicating that the data bus is available for transferring the mask to the mask register.

For the 'send and receive state' commands, 32 shifts bring a word of 32 bits from the LSSD register. Bit 32 of the Mask register determines if a word of state data is to be transferred to or from the process repeats for the next 32 bits from the LSSD register until 1024 bits have been transferred to and from the LSSD register.

A typical set of instructions which the D-CPU would cause to be placed on the Data Address R/W Bus to be picked up by the Command Control unit would be, for example, that shown in Table 1. The Table shows the function required of the system, it being understood that the instruction format illustrated in FIG. 6 would be followed. In all of these instructions, the high order 14 bits would be all "1" and the particular command or operation desired would be specified by setting one of the 7 bits in the low order, 7 bits of the address field to a "1". The Table illustrates what would happen in each of the three basic units as shown in FIG. 1 (the H-machine, the Interface Unit and the D-machine) for each separate instruction. Thus, the example places one of three operating mode commands (end of cycle) in the Start/Stop Controls block loads a mask into the Mask Register, causes data to be transferred from the LSSD registers into the Interface Unit and subsequently causes different state data to be returned to the LSSD registers in the H-machine.

TABLE 1

| D-Machine | Interface | Host |
|---|---|---|
| 1. Set 'Cycle End' | 2. Start/Stop Controls Set | |
| 3. Send Mask | 4. Mask Loaded in Mask Register | |
| 5. Send State | 6. Reads State from D-Machine and Shifts Output Register to LSSD | |
| 7. Start Host CPU | | 8. Runs One Cycle and Signals 'End of Cycle' |
| | 9. Sends Interrupt to D-CPU | |
| 10. Receive State (From LSSD Register Under Same Mask) | | |
| | 11. Shifts LSSD from Host and Writes into D Memory | |
| 12. Analyze State | | |
| 13. If Error Exists Then (Enter a Diagnostic Routine, Save State, Send New Diagnostic State) Else (Continue) | | |
| | 14. Transfers State to LSSD | |
| 15. Start Host CPU | | 16. Runs One Cycle and Signals End of Cycle. |

In the table it should be understood that only those items appearing under the D-machine column are actual instructions interpreted by the Command Control block as described previously. Each of the numbered occurrences 1 through 16 is indicated as occurring sequentially since the time axis is considered to be the vertical direction in the table. However, it will be appreciated that many of the items occur substantially simultaneously. Thus, item 1, which is an instruction to "Set Cycle End Mode" causes the Interface unit to set the appropriate logic in the Start/Stop control block of the Interface unit (item 2). Similarly instruction 3 "Send Mask" causes item 4 in the Interface unit to occur which is the loading of the actual Mask from the D-machine memory into the Mask register in the Interface.

Item 5 "Send State" causes the desired state configuration to be read from the D-machine memory into the Output register and then causes the contents of the Output register to be shifted into the LSSD registers of the H-machine (item 6). Item 7 is again an instruction in the D-Machine which signals that the Host CPU should resume operation. This causes item 8 to occur whereby the Host runs for one cycle and signals on its 'Cycle End' output line that an end of cycle has been reached.

Item 9 in the Interface unit causes an 'interrupt' signal to be sent to the D-CPU. This is actually the end of the one cycle sequence and at this time the next instruction, 10, which would be sent by the D-machine controls would be a 'receive state' instruction which means that the state data in the LSSD registers should be transferred to the LSSD controls (assumedly under the same mask specified in item 3).

Item 11 in the Interface unit indicates that the LSSD contents are entered into the LSSD controls (Input Register) under the mask and subsequentially written into the D-machine memory for analysis. Instruction item 12 in the D-machine causes the state data to be analyzed. Instruction 13 is essentially a diagnostic anaylsis routine forming no part of the present invention, however, as will be appreciated, if an error is detected than some sort of a diagnostic routine would be entered which would cause the erroneous state to be saved in the D-machine and a new diagnostic state returned to the H-machine (at some point in time). It is possible that, depending upon the nature of the error, the H-machine would remain interrupted until the difficulty is resolved.

Assuming that new state data is to be transferred to the LSSD registers as a result of the diagnostic routine of item 13, then specified data is read from the D-machine memory and shifted into the LSSD registers of the Host (item 14). Instruction item 15 causes the Host CPU to be restarted, as in instruction 7 above and in item 16 the Host runs one cycle and signals "end of cycle" as in item 8 above.

It will be apparent from the above description of the disclosed Diagnostic/Debug System that many changes could be made in the form and details of the data acquisition hardware architecture of the present system without departing from the basic concepts present. Similarly, additional enhancements could be made to the present system for achieving greater economy of operation either within the Host machine being monitored, or within the D-machine itself. One such enhancement which increases the performance of the H-machine and the efficiency of operation of the D-machine follows.

If the H-machine is under diagnosis as in FIG. 1, the readout of the machine state (LSSD registers) occurs at every cycle or every instruction execution as described. The Diagnostic machine is invoked at every read-out time, resulting in the execution of a number of instructions in the D-machine. This results in a degradation of the performance of the H-machine of, perhaps, several orders of magnitude, depending upon the relative speeds of the two machines. If the D-machine must indeed examine every readout, than that degradation is the inherent cost of this method of diagnosis. It is, however, likely that the D-machine is not interested in every readout. It may, for example, be interested only in the operation Floating-Point Multiply or in any operation which has, as its hex digit, the character "F" or any of a number of other probably low frequency items.

Figure 10:
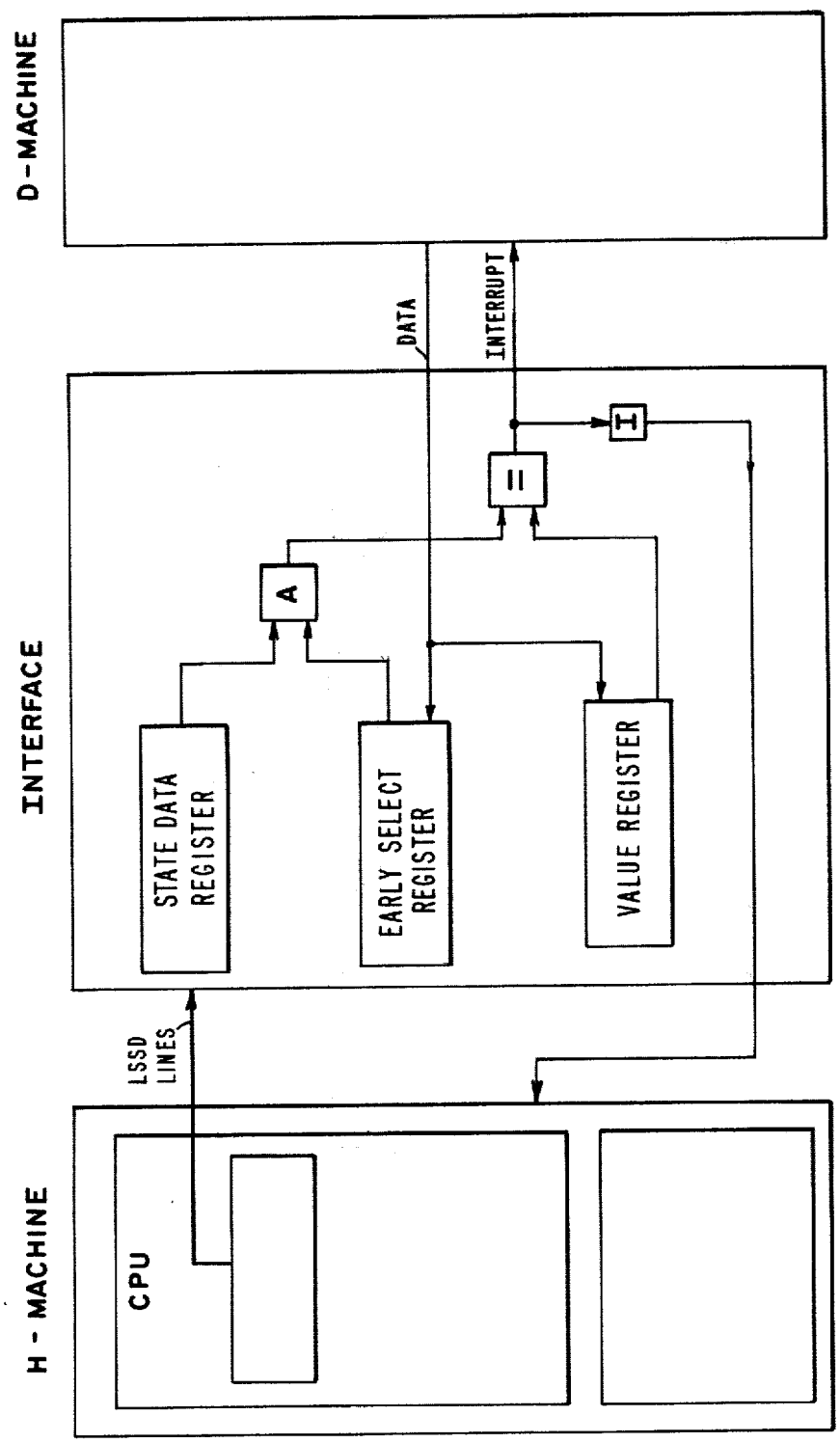
FIG. 10 comrises a functional block diagram of an "early selection" enhancement feature for the present system.

Thus, it would be desirable to so design the controls of the present Diagnostic/Debug system so that only those operations in which the system is currently interested, would be examined and, of those, only anomalous situations would cause the invoking of the D-machine. This could be done by utilizing some sort of early selection stage wherein the readout from the H-machine might be placed in a first register such as the input register. The diagram in FIG. 10 illustrates the technique. Another register containing an Early Selection Mask would be provided and the contents of the Input Register and the Early Selection Mask Register could be bitwise ANDed resulting in a bit string of zeros everywhere except for those fields isolated by the Early Selection Mask. This resultant bit string would then be compared with the contents of a third register (a value register or collection of value registers organized as an associative store) which contains a bit configuration in which the D-machine is interested. As a result of a comparison, (i.e., an equal condition), the D-machine would be invoked and control would proceed as with the present system so that the complete state data contents could be transferred into the D-machine. If, however, the comparison results in an unequal condition, the D-machine is not invoked and the H-machine is immediately released. It is presumed that the D-machine would load the appropriate Early Selection Mask and Value Registers with predetermined bit strings which will require its invocation only when there are occurrences of state changes which it wishes to examine, and if these occurrences are infrequent, the performance degradation in the H-machine will be correspondingly less severe.

The use of such an Early Selection enhancement could be made modal, so that when the diagnostic system is not in the early selection mode, the system would run as described previously. Stated differently, if such an Early Selection enhancement were used, the circuitry could be utilized solely for the purpose of indicating to the system that a desired anomalous condition had occurred and at that point the previously described data transfer of the state data into the registers, 32 bits at a time, could occur under a special interrupt instruction sent to the D-machine by the Early Selection hardware. It will of course also be appreciated that the above described registers could themselves be modified for direct transfer of data, into and out of the D-machine.

Industrial Applicability

The herein disclosed Diagnostic/Debug System has application for the monitoring of any Host computer utilizing the LSSD design concept. When the D-machine is used for diagnostics it may be used to exhaustively test the hardward portion of the computer. It may be used to find the specific hardware faults causing the detected error conditions. If the H-machine is a high performance machine with interruptible instructions, the end of cycle mode allows a view of the state of the machine during interrupt.

As a Debug machine, it acts as a probe into the Host CPU and its memory without interferring with the environment of the CPU. It could easily determine if a given instruction is being executed or if a particular branch is being taken. A dual compiler could be written for the H-CPU and the D-CPU. Such a compiler would allow symbolic names which are commonly used for the two programs to be resolved to the same locations in the H-machine memory.

The present Diagnostic/Debug machine thus has application whenever it is desired to diagnose the machine or debug a program, it being noted that the system can be attached to the Host machine at any time whether the machine is new and being brought up for the first time, or has been in service for many years. When the H-machine works properly, the Interface unit may be removed and a simple unit replaces it so that the H-machine can run normally. The Interface and D-machine can then be used to service other defective H-machines. They are not permanently connected to H-machines.

Having thus described our invention, what we claim as new, and desire to secure by Letters Patent is:

1. A Diagnostic/Debug computing system for use with a Host computer (H-machine) incorporating the LSSD design concept, said LSSD design including the provision of LSSD registers incorporated in predetermined functional units of said H-machine, said Host computer having an external interface including a LSSD input line, a LSSD output line, a LSSD shift line, output lines for indicating the end of predetermined operational sequences within the H-machine, and a "run CPU" input line which must be supplied with a predetermined signal in order for the H-machine to run, all of said lines being connected to said external interface, said Diagnostic/Debug computing system comprising an interface unit and a processing unit (D-machine) said interface unit being interposed between said H-machine external interface and a similar interface in said D-machine in data exchange relationship with both, said interface unit including first register means for initially receiving state data via the LSSD output line from the H-machine external interface to be transferred to said D-machine for diagnostic purposes and second register means connected to the LSSD input line of the H-machine external interface for receiving state data from the D-machine to be stored in predetermined locations in the LSSD registers of said H-machine, control means within said interface unit actuable by said D-machine to cause state data to be selectively transferred between said H-machine and D-machine via said register means,
said D-machine including programmable control means for effecting the execution of predetermined diagnostic programs therein which require the access of state data from and the transfer of state data to the H-machine at predetermined times during the operating cycle of said H-machine, said programmable control means in said D-machine further including means for specifying to the interface unit and H-machine when said state data is to be transferred between the LSSD registers in the H-machine and storage means located in said D-machine and in which direction.

2. A Diagnostic/Debug computing system as set forth in claim 1 wherein said interface unit further includes a mask register for storing a control mask which determines which segments of the state data being transferred between the H-machine and the Diagnostic/Debug system are to be transferred to the D-machine or altered before being returned to the H-machine,
said programmable control means in said D-machine including means for storing a predetermined control mask in said mask register means to effect said controlled transfer of data between said H-machine and said D-machine.

3. A Diagnostic/Debug computing system as set forth in claim 2 wherein the entire state data within the LSSD registers of the H-machine is of a total length approximately equal to m data words each containing n bits and wherein said mask register in said interface unit contains m bit positions, control means in said interface unit for accessing consecutive bit positions of said mask register during the transfer of data between said H-machine and D-machine whereby said single bit position of said mask register controls the transfer of n bits of state data.

4. A Diagnostic/Debug system as set forth in claim 2 including means within the programmable control means in said D-machine for controlling the running status of the H-machine including means for causing an interrupt of said H-machine selectively at an "end of cycle", or at an "end of instruction" or for specifying that it is to "run" continuously, and means for resuming the operation of the H-machine by energizing the "run CPU" input line thereto wherein said means include "end of cycle, "end of instruction" and "run CPU" lines attached to the interface of the H-machines.

5. A diagnostic/Debug computing system as set forth in claim 4 including a D-machine interrupt line actuable by the interface unit for causing an interrupt to occur in said D-machine when the H-machine reaches a specified point in its operational cycle and further means operative to continue the running of the D-machine after the completion of a state data transfer requested by the D-machine which caused the interrupt.

6. A Diagnostic/Debug computing system as set forth in claim 5 including means for initiating the transferring of state data between the components of the system which includes control means for continuously monitoring instructions being processed within D-machine for the existence of a predetermined instruction format and means responsive thereto to effect the particular data transfer operation specified.

7. A Diagnostic/Debug computing system as set forth in claim 2 including an early selection means for specifying certain state data conditions which must exist before the D-machine will be actuated, said early selection means including input register means in said interface unit in which state data accessed from the LSSD registers in said H-machine is temporarily stored, mask register means in said interface unit loadable from said D-machine for specifying those portions of the state data in which the D-machine is interested and value register means in said interface unit loadable from said D-machine for specifying data conditions in those portions of the state data previously specified by the mask register which must exist prior to causing actuation of said D-machine.

8. A LSSD state data acquisition architecture for a diagnostic/debug computing system for monitoring the operation of a host computer (H-machine), said H-machine incorporating the LSSD design concept, said LSSD design including the provision of LSSD registers incorporated in predetermined functional units of said H-machine, said H-machine having an external interface including a LSSD input line, a LSSD output line, a LSSD shift line, output lines for indicating the end of predetermined operational sequences within the H-machine, and a "run CPU" line which must be actuated in order for the H-machine to run, all of said lines being connected to said external interface said diagnostic/debug computing system comprising an interface unit and a processing unit (D-machine), said interface unit being interposed between said H-machine external interface and a similar interface in said D-machine in data exchange relationship with both, said interface unit including first register means for initially receiving state data from the H-machine to be transferred to said D-machine for diagnostic purposes, second register means for storing state data from the D-machine to be stored in predetermined locations in the LSDD registers of said H-machine, and selectively connectable to the LSDD out and LSDD in lines respectively on the external interface of said H-machine and mask register means for storing a control mask supplied by the D-machine which determines which segments of state data being transferred between the H-machine and the diagnostic/debug system are to be transferred to the D-machine or altered before being returned to the H-machine, control means within said interface unit actuable by said D-machine to cause state data to be selectively transferred between said H-machine and D-machine via said register means, said D-machine including programmable control means for effecting the execution of predetermined diagnostic programs therein which require the access of state data from and transfer of state data to the H-machine at predetermined times during the operating cycle of said H-machine, said programmable control means further including means for specifying to the interface unit and H-machine the desired operating mode of the H-machine which will cause a state data transfer to occur, further control means for causing interrupts to occur in both the H-machine and D-machine when a specified state in the H-machine's operational sequence occurs and a state data transfer must be performed and subsequently for continuing the operation of both the H-machine and the D-machine upon completion of the required transfers of state data.

9. A LSSD state data acquisition architecture for a diagnostic/debug computing system as set forth in claim 8, wherein said control means include means selectively actuable to cause the transfer of state data to and from the diagnostic/debug system at the end of every operational cycle in the H-machine or at the end of every instruction execution in the H-machine depending upon which operational mode is specified by the D-machine.

10. A LSSD state data acquisition architecture for a diagnostic/debug computing system as set forth in claim 9 including an early selection control means for specifying certain data conditions which must be found to exist before the D-machine will be interrupted, said early selection means including these registers in said interface unit comprising input register means in which state data from the LSSD registers in said H-machine is temporarily stored, mask register means loadable from said D-machine for specifying those portions of the state data in which the D-machine is interested and value register means for specifying particular data configurations within those portions of the state data previously specified by the mask register which must exist prior to causing an interrupt of said D-machine and logic means also located in said interface unit for combining the contents of said three registers to effect the desired interrupt of said D-machine.

* * * * *